(12) United States Patent
Zheng et al.

(10) Patent No.: US 12,733,267 B2
(45) Date of Patent: Sep. 8, 2026

(54) SINGLE-PHOTON AVALANCHE DIODES WITH HYBRID TRENCH ISOLATION STRUCTURES

(71) Applicant: GlobalFoundries Singapore Pte. Ltd., Singapore (SG)

(72) Inventors: Ping Zheng, Singapore (SG); Eng Huat Toh, Singapore (SG); Kiok Boone Elgin Quek, Singapore (SG); Soh Yun Siah, Singapore (SG); Shiang Yang Ong, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 347 days.

(21) Appl. No.: 18/384,915

(22) Filed: Oct. 30, 2023

(65) Prior Publication Data

US 2025/0142983 A1 May 1, 2025

(51) Int. Cl.
*H10F 30/225* (2025.01)
*H10F 71/00* (2025.01)
(Continued)

(52) U.S. Cl.
CPC ......... *H10F 30/225* (2025.01); *H10F 71/121* (2025.01); *H10W 10/014* (2026.01); *H10W 10/17* (2026.01)

(58) Field of Classification Search
CPC ................. H10F 30/225; H10F 71/121; H01L 21/76224; H10W 10/014; H10W 10/17
See application file for complete search history.

(56) References Cited

U.S. PATENT DOCUMENTS 7,691,722 B2 4/2010 Zhou
9,111,993 B1 8/2015 Zheng et al.
(Continued)

OTHER PUBLICATIONS

Ito, K. et al., "A Back Illuminated 10μm SPAD Pixel Array Comprising Full Trench Isolation and Cu-Cu Bonding with Over 14% PDE at 940nm." 2020 IEEE International Electron Devices Meeting (IEDM) (2020): 16.6.1-16.6.4.
(Continued)

*Primary Examiner* — Norman D Richards
*Assistant Examiner* — Sean Ayers Winters
(74) *Attorney, Agent, or Firm* — Thompson Hine LLP; Anthony Canale

(57) ABSTRACT

Structures for a single-photon avalanche diode and methods of forming a structure for a single-photon avalanche diode. The structure comprises a semiconductor layer on a semiconductor substrate, a cathode comprising a first doped region in the semiconductor substrate, and an anode comprising a second doped region adjacent to a top surface of the semiconductor layer. The structure further comprises a first trench isolation structure including a first conductor layer extending from the top surface of the semiconductor layer through the semiconductor layer to the first doped region. The first conductor layer of the first trench isolation structure is connected to the first doped region. The structure further comprises a second trench isolation structure adjacent to the first trench isolation structure. The second trench isolation structure includes a second conductor layer extending from the top surface of the semiconductor layer fully through the first doped region.

20 Claims, 3 Drawing Sheets

(51) Int. Cl.

| | |
|---|---|
| ***H10W 10/00*** | (2026.01) |
| ***H10W 10/17*** | (2026.01) |

(56) References Cited

U.S. PATENT DOCUMENTS

| | | | | |
|---|---|---|---|---|
| 11,784,196 | B2 | 10/2023 | Zheng et al. | |
| 2019/0157323 | A1* | 5/2019 | Ogi | H10F 39/199 |
| 2020/0152807 | A1* | 5/2020 | Röhrer | H10F 77/14 |
| 2021/0305439 | A1* | 9/2021 | Hayashi | H10F 77/959 |
| 2022/0005849 | A1 | 1/2022 | Zang et al. | |
| 2022/0367534 | A1* | 11/2022 | Gambino | H10F 39/802 |
| 2023/0065063 | A1* | 3/2023 | Zheng | H10F 39/024 |
| 2023/0268365 | A1* | 8/2023 | Kurata | H10F 30/225<br>257/432 |

OTHER PUBLICATIONS

Angelo Gulinatti, Francesco Ceccarelli, Massimo Ghioni, and Ivan Rech, "Custom silicon technology for SPAD-arrays with red-enhanced sensitivity and low timing jitter," Optics Express 29, 4559-4581 (2021).

Zheng, Ping et al., "Trenchless Single-Photon Avalanche Diodes" filed on Aug. 22, 2023 as a U.S. Appl. No. 18/236,484.

* cited by examiner

T
10
12
14
11
16
18
19
20
22
24

SINGLE-PHOTON AVALANCHE DIODES WITH HYBRID TRENCH ISOLATION STRUCTURES

BACKGROUND

The disclosure relates to semiconductor device fabrication and integrated circuits and, more specifically, to structures for a single-photon avalanche diode and methods of forming a structure for a single-photon avalanche diode.

A single-photon avalanche diode is a type of solid-state photodetector belonging to the same device family as photodiodes and avalanche photodiodes. A fundamental difference between single-photon avalanche diodes and other types of photodetectors is that a single-photon avalanche diode is biased well above its reverse-bias breakdown voltage. When a single-photon avalanche diode is placed under such a high reverse bias, photon-initiated carriers are accelerated by the electric field to a kinetic energy that is sufficient to eject electrons out of atoms of the bulk material constituting the absorption region of the single-photon avalanche diode. A large avalanche of carriers grows exponentially and can be triggered in the bulk material by as few as a single photon-initiated carrier that is accelerated by the electric field. A single-photon avalanche diode can detect single photons providing short duration current pulses that can be counted or used to obtain a time of arrival for an incident single photon.

A single-photon avalanche diode may include a cathode that is formed as a doped well in a substrate and an epitaxial layer that is formed on the substrate after the cathode is formed. The sensitivity of the single-photon avalanche diode scales upwardly as the thickness of the epitaxial layer increases. A cathode contact to the doped well may be formed as a doped region in the epitaxial layer by ion implantation. However, the depth of the cathode contact formed by ion implantation is limited by the range of the ions, which is constrained by the maximum operational voltage of the ion implanter. If the cathode contact is shallower than the thickness of the epitaxial layer due to this limitation, then a high impedance is introduced by an undoped region of the epitaxial layer that is arranged between the cathode contact and the cathode. The anode of the single-photon avalanche diode may also be susceptible to early edge breakdown because of the proximity of the ion-implanted cathode contact.

Improved structures for a single-photon avalanche diode and methods of forming a structure for a single-photon avalanche diode are needed.

SUMMARY

In an embodiment of the invention, a structure for a single-photon avalanche detector is provided. The structure comprises a semiconductor layer on a semiconductor substrate, a cathode including a first doped region in the semiconductor substrate, and an anode including a second doped region adjacent to a top surface of the semiconductor layer. The structure further comprises a first trench isolation structure including a first conductor layer extending from the top surface of the semiconductor layer through the semiconductor layer to the first doped region. The first conductor layer of the first trench isolation structure is connected to the first doped region. The structure further comprises a second trench isolation structure adjacent to the first trench isolation structure. The second trench isolation structure includes a second conductor layer extending from the top surface of the semiconductor layer fully through the first doped region.

In an embodiment of the invention, a method of forming a structure for a single-photon avalanche detector is provided. The method comprises forming a cathode that includes a first doped region in a semiconductor substrate, forming a semiconductor layer on the semiconductor substrate, forming an anode that includes a second doped region adjacent to a top surface of the semiconductor layer, forming a first trench isolation structure that includes a first conductor layer extending from the top surface of the semiconductor layer through the semiconductor layer to the first doped region, and forming a second trench isolation structure adjacent to the first trench isolation structure. The first conductor layer of the first trench isolation structure is connected to the first doped region, and the second trench isolation structure includes a second conductor layer extending from the top surface of the semiconductor layer fully through the first doped region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
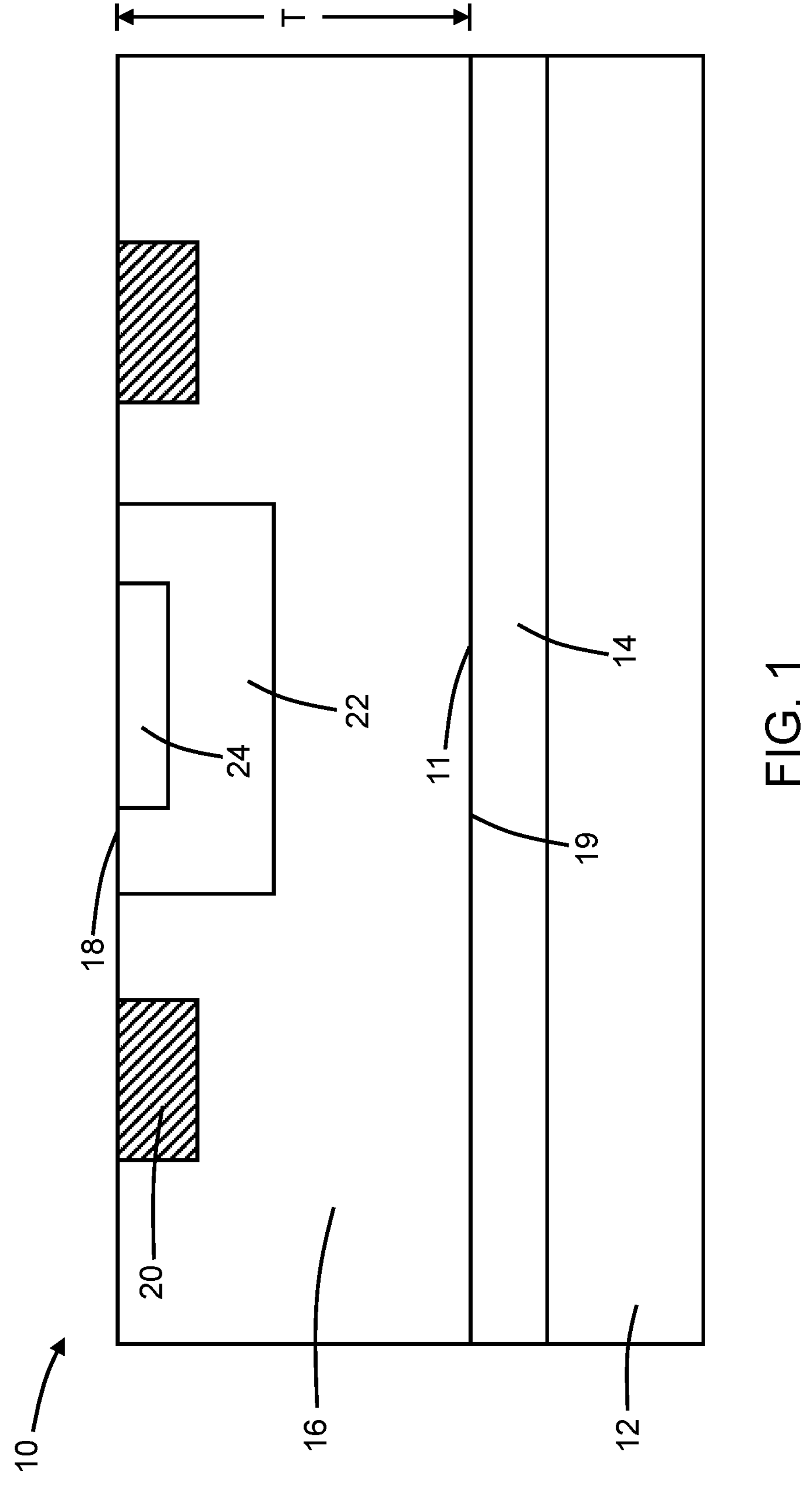
FIG. 1 is a cross-sectional view of a structure at an initial fabrication stage of a processing method in accordance with embodiments of the invention.

With reference to FIG. 1 and in accordance with embodiments of the invention, a structure 10 for a single-photon avalanche diode includes a semiconductor substrate 12 that is comprised of a semiconductor material, such as single-crystal silicon, and a doped region 14 that is formed in the semiconductor substrate 12 adjacent to a top surface 11 of the semiconductor substrate 12. In an embodiment, the semiconductor substrate 12 may contain semiconductor material lightly-doped with a p-type dopant, such as boron, to provide p-type electrical conductivity.

The doped region 14 may be formed by, for example, a blanket ion implantation process and may be doped to have an opposite conductivity type from the semiconductor substrate 12. The implantation conditions, such as ion species, dose, and kinetic energy, may be selected to tune the electrical and physical characteristics of the doped region 14. In an embodiment, the semiconductor material of the doped region 14 may receive and contain an n-type dopant, such as arsenic or phosphorus, that provides n-type electrical conductivity.

A semiconductor layer 16 is formed with a given thickness T on the top surface 11 of the semiconductor substrate 12 after the doped region 14 is formed. The semiconductor layer 16 may be comprised of a semiconductor material, such as single-crystal silicon, that is epitaxially grown as a blanket coating using an epitaxial growth process. In an embodiment, the semiconductor layer 16 may comprise a semiconductor material, such as silicon, that is doped to have an opposite conductivity type from the semiconductor substrate 12 and the same conductivity type as the doped region 14. The doped region 14 may adjoin the semiconductor layer 16 across an interface 19, which may be coextensive with the top surface 11 of the semiconductor substrate 12. In an embodiment, the thickness T of the semiconductor layer 16 may range from about 8 microns to about 12 microns.

A shallow trench isolation structure 20 is formed that extends from a top surface 18 of the semiconductor layer 16 to a shallow depth into the semiconductor layer 16. The shallow trench isolation structure 20 may comprise a dielectric material, such as silicon dioxide, that is an electrical insulator. The shallow trench isolation structure 20 may be formed by patterning a shallow trench with lithography and etching processes, depositing a dielectric material, such as silicon dioxide, in the shallow trench, and planarizing and/or recessing the deposited dielectric material.

A doped well 22 and a doped region 24 are formed in portions of the semiconductor layer 16 adjacent to the top surface 18 of the semiconductor layer 16. The semiconductor material of the doped well 22 and the doped region 24 have an opposite conductivity type from the semiconductor material of the semiconductor layer 16. In an embodiment, the semiconductor material of the doped well 22 and the doped region 24 may receive and contain a p-type dopant, such as boron, that provides p-type electrical conductivity. In an embodiment, the semiconductor material of the doped region 24 may contain a higher concentration of the p-type dopant than the doped well 22. The doped region 24, which may be coextensive with the top surface 18, is surrounded on multiple sides by the doped well 22.

The doped well 22 may be formed by, for example, a selective ion implantation process using an implantation mask with an opening that determines a portion of the semiconductor layer 16 targeted to be implanted. The implantation mask may include a layer of a light-sensitive material, such as a photoresist, applied by a spin-coating process, pre-baked, exposed to light projected through a photomask, baked after exposure, and developed with a chemical developer to define the opening. The implantation conditions, such as ion species, dose, and kinetic energy, may be selected to tune the electrical and physical characteristics of the doped well 22. The implantation mask, which has a thickness adequate to stop the ions outside of the opening, may be stripped after forming the doped well 22.

The doped region 24 may be formed by, for example, a selective ion implantation process using an implantation mask with an opening that determines a portion of the semiconductor layer 16 targeted to be implanted. The implantation mask may include a layer of a light-sensitive material, such as a photoresist, applied by a spin-coating process, pre-baked, exposed to light projected through a photomask, baked after exposure, and developed with a chemical developer to define the opening. The implantation conditions, such as ion species, dose, and kinetic energy, may be selected to tune the electrical and physical characteristics of the doped region 24. The implantation mask, which has a thickness adequate to stop the ions outside of the opening, may be stripped after forming the doped region 24.

Figure 2:
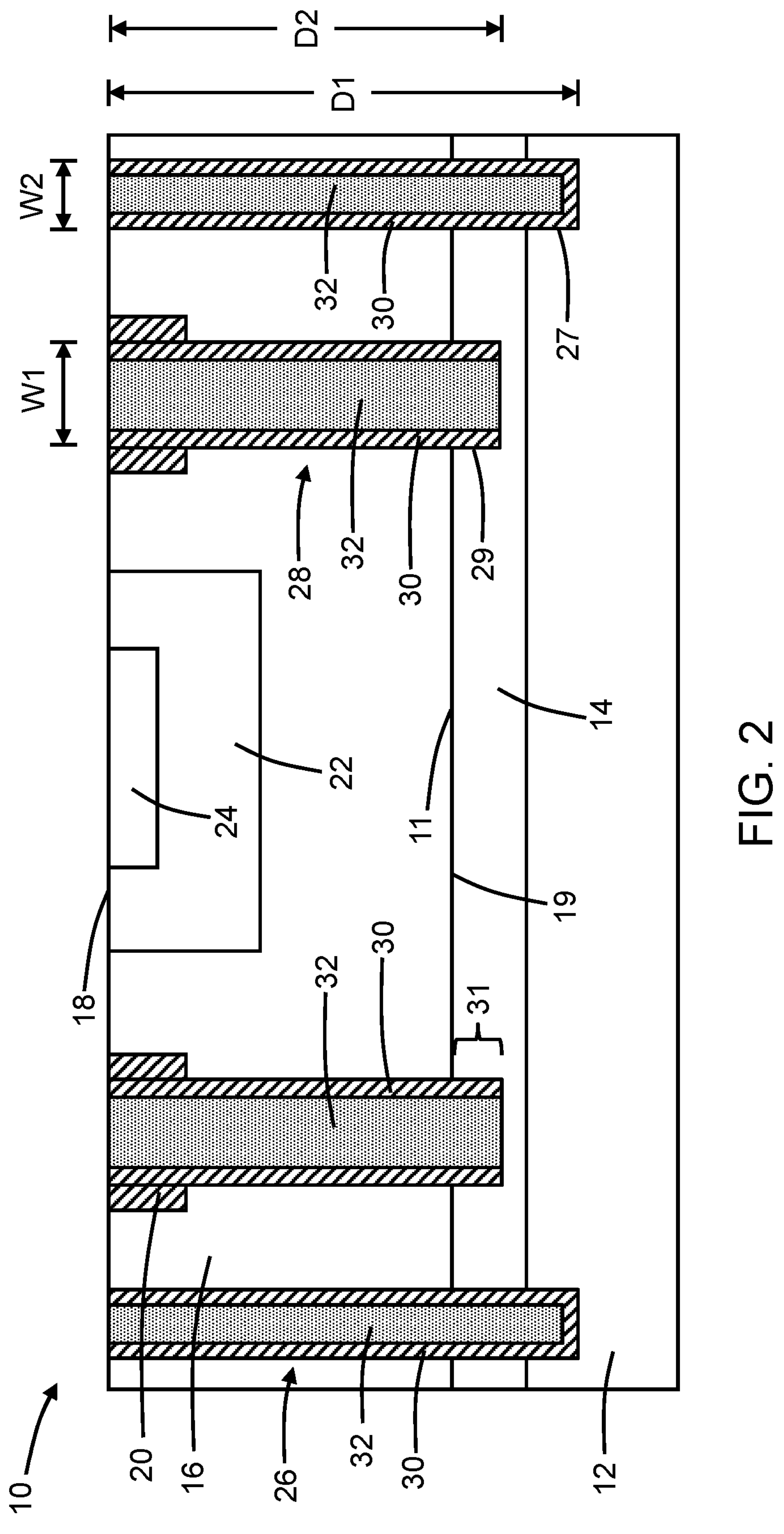
FIG. 2 is a cross-sectional view of the structure at a fabrication stage subsequent to FIG. 1.

With reference to FIG. 2 in which like reference numerals refer to like features in FIG. 1 and at a subsequent fabrication stage of the processing method, a deep trench isolation structure 26 and an intermediate trench isolation structure 28 are formed that extend from a top surface 18 of the semiconductor layer 16 to different depths. The intermediate trench isolation structure 28 surrounds a portion of the semiconductor layer 16 including the doped well 22 and doped region 24. The deep trench isolation structure 26 surrounds the intermediate trench isolation structure 28 in addition to surrounding the portion of the semiconductor layer 16 including the doped well 22 and doped region 24.

The deep trench isolation structure 26 and intermediate trench isolation structure 28 may be formed by patterning trenches 27, 29 in the semiconductor substrate 12, lining the trenches 27, 29 with a dielectric layer 30 that partially fills the trenches 27, 29, selectively removing the dielectric layer 30 from the bottom of the trench 29, and filling the trenches 27, 29 with a conductor layer 32. To that end, an etch mask is formed by a lithography process over the semiconductor layer 16. The etch mask may include a layer of a light-sensitive material, such as a photoresist, applied by a spin-coating process, pre-baked, exposed to light projected through a photomask, baked after exposure, and developed with a chemical developer to define openings arranged over portions of semiconductor layer 16 targeted to be etched to define the trenches 27, 29. An etching process may be used to concurrently form both of the trenches 27, 29 at the locations of the openings in the etch mask. The etch mask may be stripped after forming the trenches 27, 29.

The dielectric layer 30 may be comprised of a dielectric material, such as silicon dioxide, that is an electrical insulator and that is deposited with a conformal thickness. The conductor layer 32 may be comprised of a conductor, such as doped polysilicon, that is deposited and planarized. In an embodiment, the dielectric layer 30 of the deep trench isolation structure 26 may be disposed on the bottom, inner sidewall, and outer sidewall of the trench 27 as a liner, and the conductor layer 32 may be formed as a core inside the dielectric layer 30 on the bottom, inner sidewall, and outer sidewall of the trench 27. The conductor layer 32 of the deep trench isolation structure 26 is electrically isolated by the dielectric layer 30 from the semiconductor substrate 12, the doped region 14, and the semiconductor layer 16. In an embodiment, the dielectric layer 30 of the intermediate trench isolation structure 28 may include sections that are formed on the inner and outer sidewalls of the trench 29, and the conductor layer 32 may be formed as a core between the section of the dielectric layer 30 on the inner sidewall of the trench 29 and the section of the dielectric layer 30 on the outer sidewall of the trench 29.

In an embodiment, the dielectric layer 30 may be comprised of a dielectric material, such as silicon dioxide, that is an electrical insulator. In an embodiment, the conductor layer 32 may be comprised of polycrystalline silicon (polysilicon) doped, for example, with an n-type dopant, such as arsenic or phosphorus, that provides n-type electrical conductivity. In alternative embodiments, the conductor layer 32 may be comprised of a metal, a combination of doped polysilicon and metal, or other combinations of materials that are electrical conductors.

The deep trench isolation structure 26 and trench 27 may extend from the top surface 18 to a greater depth than the intermediate trench isolation structure 28 and trench 29. In an embodiment, the deep trench isolation structure 26 and trench 27 may penetrate fully through the semiconductor layer 16 and the doped region 14, and then may penetrate into a portion of the semiconductor substrate 12 beneath the doped region 14. The intermediate trench isolation structure 28 and trench 29 may penetrate fully through a portion of the shallow trench isolation structure 20 and the semiconductor layer 16 beneath the shallow trench isolation structure 20, and then may penetrate partially through the doped region 14.

A bottom portion 31 of the conductor layer 32 of the intermediate trench isolation structure 28 may terminate inside the doped region 14 and below the interface 19 such that the bottom portion 31 of the conductor layer 32 is electrically and physically connected to the doped region 14. In an embodiment, the bottom portion 31 of the conductor layer 32 of the intermediate trench isolation structure 28 may directly contact the doped region 14. The conductor layer 32 is electrically and physically isolated by the dielectric layer 30 from the semiconductor layer 16 over a portion of the trench 29 between the doped region 14 and the top surface 18. The conductor layer 32 of the intermediate trench isolation structure 28 provides a conductive path extending from the top surface 18 of the semiconductor layer 16 to the doped region 14 in the semiconductor substrate 12.

In an embodiment, the deep trench isolation structure 26 may extend from the top surface 18 to a depth D1 in the semiconductor substrate 12, and the intermediate trench isolation structure 28 may extend from the top surface 18 to a depth D2 in the semiconductor substrate 12. The depth D2 of the intermediate trench isolation structure 28 is greater than the depth of the shallow trench isolation structure 20, and the depth D1 of the deep trench isolation structure 26 is greater than the depth D2 of the intermediate trench isolation structure 28. The etch rate for the portion of the trench 29 penetrating through the shallow trench isolation structure 20 may be reduced to contribute to the depth difference between the intermediate trench isolation structure 28 and the deep trench isolation structure 26.

The intermediate trench isolation structure 28 may have a width dimension W1, which may be established when patterning the associated trench 29 of nominally the same width dimension. The deep trench isolation structure 26 has a width dimension W2 that may be established when patterning the associated trench 27 of nominally the same width dimension. The width dimension W1 of the intermediate trench isolation structure 28 and trench 29 is greater than the width dimension W2 of the deep trench isolation structure 26 and trench 27.

An etching process may be utilized, before forming the conductor layer 32, to selectively remove the dielectric layer 30 from the bottom of the trench 29 for the intermediate trench isolation structure 28. The intact sections of the dielectric layer 30 are thereby formed on the inner and outer sidewalls of the trench 29 of the intermediate trench isolation structure 28. The dielectric layer 30 also remains intact on the bottom, inner sidewall, and outer sidewall of the trench 27 for the deep trench isolation structure 26. The larger width dimension W2 of the trench 29, in comparison with the narrower width dimension W1 of the trench 27, results in the selective removal of the dielectric layer 30 from bottom of the trench 29 but not from the bottom of the trench 27.

The single-photon avalanche diode has a separate absorption, charge, and multiplication (SACM) design. The doped region 14 may supply a cathode of the single-photon avalanche diode, and the doped region 24 may supply an anode of the single-photon avalanche diode. Back-end-of-line processing may be used to form an interconnect structure with vias and wiring coupled to the anode and the cathode of the single-photon avalanche diode.

In use, incident radiation is absorbed in the absorption region of the single-photon avalanche diode defined by the doped well 22, and signal amplification occurs in the multiplication region defined by the portion of the semiconductor layer 16 between the doped well 22 and the doped region 14. The single-photon avalanche diode is biased between the anode and cathode above the avalanche breakdown voltage. When an incident photon is absorbed in the absorption region, an electron-hole pair is created, and the electron drifts into the multiplication region. An avalanche current is generated in the multiplication region by the creation of additional electron-hole pairs through impact ionization. The collected avalanche current provides a detectable electronic signal that can be output from the single-photon avalanche diode in a current path from the cathode defined by the doped region 14 through the intermediate trench isolation structure 28 to the top surface 18 of the semiconductor layer 16.

The conductor layer 32 of the intermediate trench isolation structure 28 is physically and electrically connected to the cathode defined by the doped region 14. The physical and electrical connection between the conductor layer 32 of the intermediate trench isolation structure 28 and the doped region 14 enables an increase in the thickness of the semiconductor layer 16, which thereby enables an increase in the sensitivity of the single-photon avalanche diode in comparison with conventional single-photon avalanche diodes having a smaller layer thickness. The intermediate trench isolation structure 28 eliminates the need for ion implantation to form a connection to the cathode that would only extend partially through the semiconductor layer 16 due to its thickness. The conductor layer 32 of the intermediate trench isolation structure 28 may provide a cathode connection that is characterized by a lower impedance in comparison with conventional ion-implanted cathode connections. The dielectric layer 30 lining the deep trench isolation structure 26 and the intermediate trench isolation structure 28 may mitigate the risk of early edge breakdown in comparison with conventional ion-implanted cathode connections.

The single-photon avalanche diode embodied in the structure 10 may be deployed in an array of single-photon avalanche diodes with either a front-side illumination configuration or a back-side illumination configuration. The deep trench isolation structure 26 may provide optical confinement that is effective to reduce optical crosstalk between neighboring single-photon avalanche diodes in the array. The intermediate trench isolation structure 28 may also contribute to, and strengthen, the optical confinement.

Figure 3:
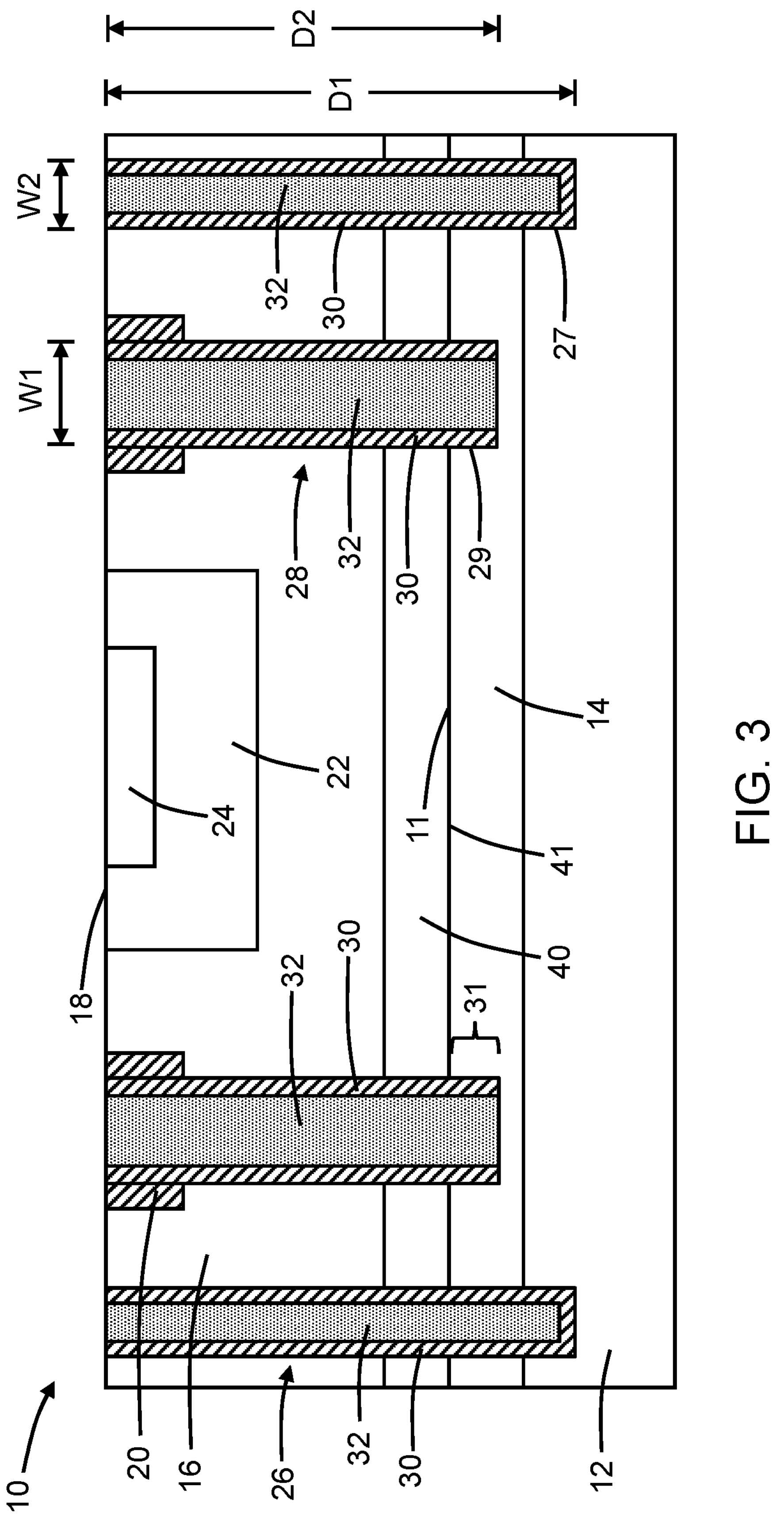
FIG. 3 is a cross-sectional view of a structure in accordance with alternative embodiments.

With reference to FIG. 3 in which like reference numerals refer to like features in FIG. 2 and in accordance with alternative embodiments, a doped region 40 may be formed in the semiconductor substrate 12 by, for example, a blanket ion implantation process and may be doped to have an opposite conductivity type from the doped region 14. The implantation conditions, such as ion species, dose, and kinetic energy, may be selected to tune the electrical and physical characteristics of the doped region 40. In an embodiment, the semiconductor material of the doped region 40 may receive and contain a p-type dopant, such as boron, that provides p-type electrical conductivity.

The doped region 40 is disposed between the doped region 14 and the doped well 22. The doped region 40 may adjoin the doped region 14 across an interface 41 across which the conductivity type changes. The doped region 40 is separated from the doped well 22 by a thickness of the semiconductor layer 16. The doped region 40 may enhance the impact-ionization junction and reduce the breakdown voltage of the single-photon avalanche diode. The intermediate trench isolation structure 28 penetrates fully through the doped region 40 to reach the doped region 14 and the conductor layer 32 of the intermediate trench isolation structure 28 is electrically isolated from the doped region 40 by the dielectric layer 30 on the sidewalls of the trench 29. The deep trench isolation structure 26 also penetrates fully through the doped region 40 and is electrically isolated from the doped region 40.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, the language of approximation may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a single-photon avalanche diode, the structure comprising:

a semiconductor substrate having a top surface and a first doped region adjacent to the top surface of the semiconductor substrate;

a semiconductor layer on the top surface of the semiconductor substrate, the semiconductor layer having a top surface and a first trench extending from the top surface of the semiconductor layer fully through the semiconductor layer to a first depth in the semiconductor substrate, and the first trench has a first sidewall and a second sidewall;

a cathode including a portion of the first doped region in the semiconductor substrate;

an anode including a second doped region adjacent to the top surface of the semiconductor layer;

a first trench isolation structure inside the first trench, the first trench isolation region including a first conductor layer and a first dielectric layer extending from the top surface of the semiconductor layer through the semiconductor layer to the portion of the first doped region, the first dielectric layer having a first section on the first sidewall and a second section on the second sidewall, the first conductor layer is positioned between the first section of the first dielectric layer and the second section of the first dielectric layer, and the first conductor layer of the first trench isolation structure is electrically and physically connected to the portion of the first doped region; and a second trench isolation structure adjacent to the first trench isolation structure, the second trench isolation structure including a second conductor layer extending from the top surface of the semiconductor layer fully through the first doped region.

2. The structure of claim 1 wherein the second conductor layer of the second trench isolation structure is disposed in a second trench extending from the top surface of the semiconductor layer through the semiconductor layer to a second depth in the semiconductor substrate, and the second depth greater than the first depth.

3. The structure of claim 2 wherein the first trench has a first width dimension at the top surface of the semiconductor layer, the second trench has a second width dimension at the top surface of the semiconductor layer, and the first width dimension is greater than the second width dimension.

4. The structure of claim 2 further comprising:

a shallow trench isolation structure in the semiconductor layer, wherein the first trench isolation structure extends through the shallow trench isolation structure into the semiconductor layer.

5. The structure of claim 1 wherein the first trench isolation structure surrounds a first portion of the semiconductor layer that includes the second doped region.

6. The structure of claim 4 wherein the second trench isolation structure surrounds the first trench isolation structure.

7. The structure of claim 4 wherein the second trench isolation structure surrounds a second portion of the semiconductor layer that includes the first trench isolation structure.

8. The structure of claim 1 further comprising:

a shallow trench isolation structure in the semiconductor layer, wherein the first trench isolation structure extends through the shallow trench isolation structure into the semiconductor layer.

9. The structure of claim 1 wherein the semiconductor layer has a thickness of about 8 microns to about 12 microns.

10. The structure of claim 1 wherein the first conductor layer directly contacts the first doped region.

11. The structure of claim 1 wherein the second trench isolation structure includes a second dielectric layer that electrically isolates the second conductor layer of the second trench isolation structure from the first doped region.

12. The structure of claim 11 wherein the second conductor layer extends from the top surface of the semiconductor layer through the first doped region and into a portion the semiconductor substrate beneath the first doped region, and the second dielectric layer is disposed between the second conductor layer and the semiconductor substrate.

13. The structure of claim 1 wherein the first conductor layer extends partially through the first doped region.

14. The structure of claim 1 wherein the first doped region has doped region has n-type electrical conductivity, and further comprising:

a third doped region in the semiconductor substrate, the third doped region disposed between the first doped region and the top surface of the semiconductor layer, and the third doped region having p-type electrical conductivity, wherein the first conductor layer of the first trench isolation structure extends fully through the third doped region to the first doped region.

15. The structure of claim 1 wherein the first conductor layer and the second conductor layer comprise doped polysilicon, a metal, or a combination of doped polysilicon and metal.

16. The structure of claim 1 further comprising:

a well in the semiconductor layer, wherein the first doped region is disposed in the well.

17. The structure of claim 1 wherein the first conductor layer directly contacts the first doped region.

18. The structure of claim 1 wherein the first doped region has n-type electrical conductivity.

19. A method of forming a structure for a single-photon avalanche diode, the method comprising:

forming a semiconductor layer on a top surface of a semiconductor substrate, wherein the semiconductor substrate includes a first doped region adjacent to the top surface of the semiconductor substrate;

forming a trench extending from a top surface of the semiconductor layer fully through the semiconductor layer to a depth in the semiconductor substrate, wherein the trench has a first sidewall and a second sidewall;

forming a cathode that includes a portion of the first doped region in the semiconductor substrate;

forming an anode that includes a second doped region adjacent to a top surface of the semiconductor layer;

forming a first trench isolation structure inside the trench, wherein the first trench isolation region includes a first conductor layer and a dielectric layer extending from the top surface of the semiconductor layer through the semiconductor layer to the portion of the first doped region, the dielectric layer has a first section on the first sidewall and a second section on the second sidewall, the first conductor layer is positioned between the first section of the dielectric layer and the second section of the dielectric layer, and the first conductor layer of the first trench isolation structure is electrically and physically connected to the portion of the first doped region; and forming a second trench isolation structure adjacent to the first trench isolation structure, wherein the second trench isolation structure includes a second conductor layer extending from the top surface of the semiconductor layer fully through the first doped region.

20. The structure of claim 18 wherein the semiconductor substrate has p-type electrical conductivity.

* * * * *